United States Patent
Ming-Huang

[11] Patent Number: 5,928,024
[45] Date of Patent: Jul. 27, 1999

[54] TRACK DEVICE FOR SUPPORTING A CPU IN AN EXTENSION PORT OF A MOTHER BOARD

[76] Inventor: Chiang Ming-Huang, 4F, No. 8, Lane 405, Sec. 6, Chubg Shan N. Road, Taipei, Taiwan

[21] Appl. No.: 08/935,662

[22] Filed: Sep. 23, 1997

[51] Int. Cl.[6] .................................................. H01R 13/64
[52] U.S. Cl. .......................... 439/377; 361/683; 361/741
[58] Field of Search .................................... 439/377, 374, 439/296, 64; 361/683, 684, 801, 802, 741

[56] References Cited

U.S. PATENT DOCUMENTS

| | | | |
|---|---|---|---|
| 3,932,016 | 1/1976 | Ammenheuser | 439/377 |
| 4,080,031 | 3/1978 | Sawford-Atkins | 439/377 |
| 5,216,578 | 6/1993 | Zenitani et al. | 439/377 |

*Primary Examiner*—Gary F. Paumen
*Attorney, Agent, or Firm*—Bacon & Thomas

[57] ABSTRACT

A track device for supporting a CPU in an extension port of a mother board, including a mounting frame fastened to the mother board at one side of the extension port and defining a vertical sliding track for guiding an inserted CPU into the expansion slot, and a support frame pivoted to the mounting frame and alternatively set between a collapsed position, a vertical position in vertical alignment with the vertical sliding track of the mounting frame for guiding an inserted CPU into the vertical sliding track of the mounting frame and the expansion port of the mother board, and stop means adapted to stop the support frame in position when the support frame it set in the vertical position.

2 Claims, 4 Drawing Sheets

TRACK DEVICE FOR SUPPORTING A CPU IN AN EXTENSION PORT OF A MOTHER BOARD

BACKGROUND OF THE INVENTION

The present invention relates to a track device for supporting a CPU in an extension port of a mother board, and more particularly to such a track device which can be collapsed to reduce its vertical installation space when not in use.

FIG. 1 shows a CPU support structure adapted for mounting on a mother board for supporting a CPU in an expansion port of the mother board. The CPU support structure comprises two upright supports 10 connected in parallel. Each upright support 10 comprises a vertical sliding track 11 adapted for guiding an inserted CPU into the expansion port of the mother board, a mounting base 12 at the bottom, two countersunk holes 12 bilaterally disposed at the mounting base 12, and two screw nuts 14 mounted the countersunk holes 12. When the CPU support structure is attached to the top side of the mother board, screws 15 are inserted into respective mounting holes of the mother board from the bottom side and then respectively threaded into the screw nuts 14 in the countersunk holes 12 to fix the upright supports 10 in place. This CPU support structure has drawbacks. Because the upright supports 10 are not collapsible, the CPU support structure occupies much installation space when not in use after its installation in the mother board. Further, because the screws 15 are fastened to the screw nuts 14 from the bottom side of the mother board, the CPU support structure must be fastened to the mother board before the installation of the mother board in the computer mainframe. When the CPU support structure is damaged, it is difficult to remove the CPU support structure from the mother board.

SUMMARY OF THE INVENTION

According to one embodiment of the present invention, the track device for supporting a CPU in an extension port of a mother board comprises a mounting frame fastened to the mother board at one side of the extension port and defining a vertical sliding track for guiding an inserted CPU into the expansion slot, and a support frame pivoted to the mounting frame and alternatively set between a collapsed position, a vertical position in vertical alignment with the vertical sliding track of the mounting frame for guiding an inserted CPU into the vertical sliding track of the mounting frame and the expansion port of the mother board, and stop means adapted to stop the support frame in position when the support frame it set in the vertical position. According to another embodiment of the present invention, the track device comprises a mounting frame having two vertical plug holes two opposite lateral sides of its vertical sliding track and a horizontal hook hole its back side, and a support frame detachably connected to the mounting frame for guiding an inserted CPU into the vertical sliding track of the mounting frame and the expansion port of the CPU, the support frame having two downward plug rods respectively plugged into the plug holes of the mounting frame and a downwardly extended back hook hooked in the horizontal hook hole of the mounting frame.

DETAILED DESCRIPTION OF THE PREFERRED EMBODIMENT

Figure 1:
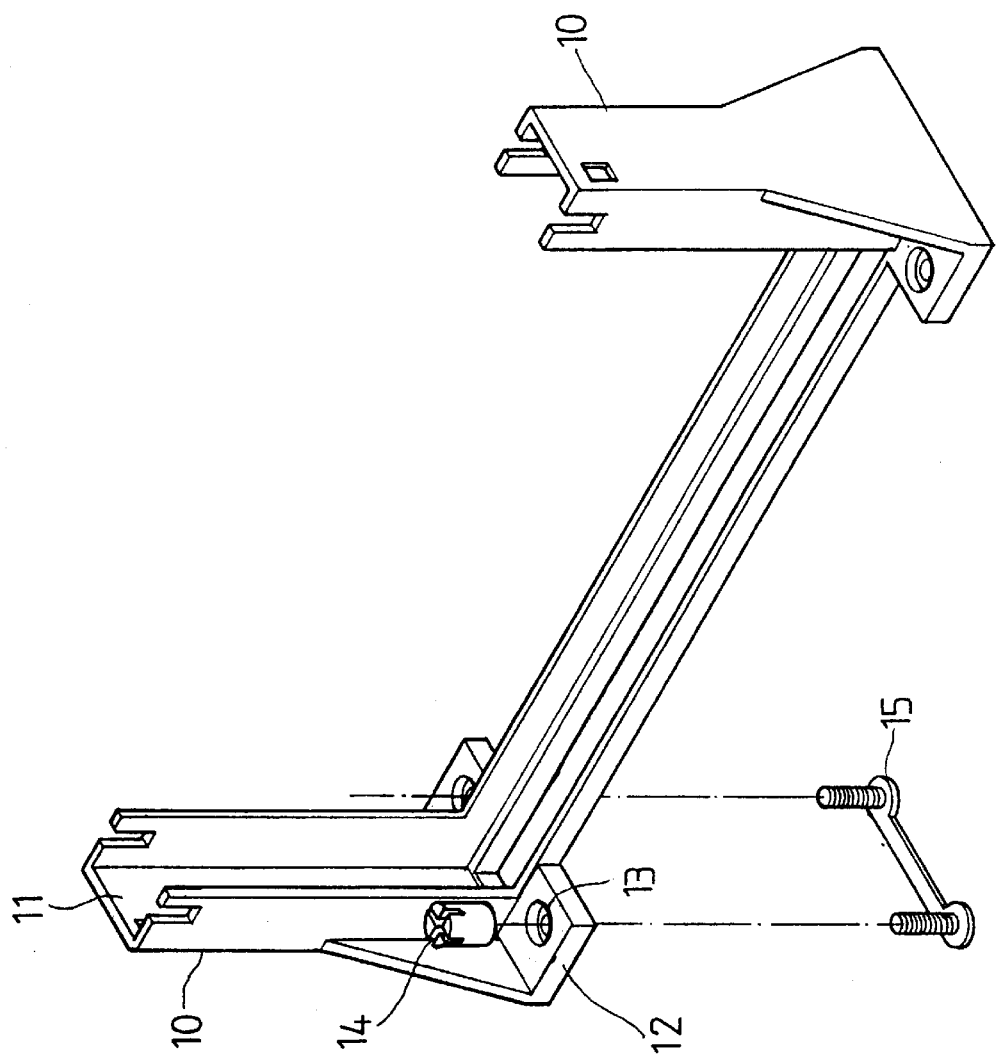
FIG. 1 shows a CPU support structure for an expansion port of a mother board according to the prior art.
Figure 2:
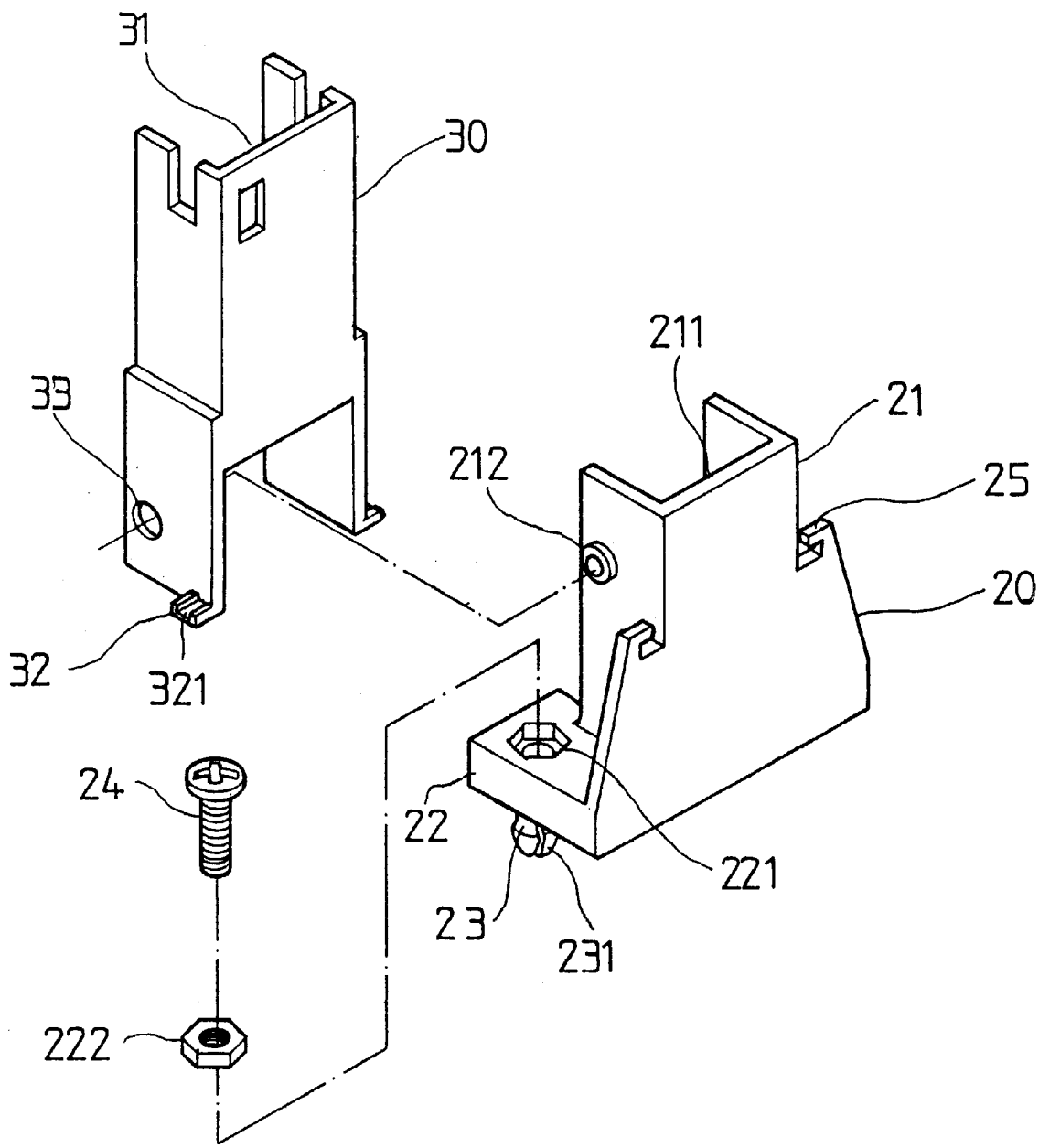
FIG. 2 is an exploded view of a track device for supporting a CPU in an extension port of a mother board according to a first embodiment of the present invention.

Referring to FIG. 2, a track device for supporting a CPU in an extension port of a mother board in accordance with a first embodiment of the present invention is generally comprised of a mounting frame 20, and a support frame 30 pivoted to the mounting frame 20. When in use, two track devices are symmetrically mounted on the mother board at two opposite sides of the extension port so that a CPU can be easily inserted in between the track devices into the expansion slot of the mother board. The mounting frame 20 comprises a horizontal mounting base 22, a vertical track wall 21 raised from the top side of the horizontal mounting base 22, two horizontal stub pivots 212 raised from two opposite sides of the vertical track wall 21, a vertical sliding track 211 defined within the vertical track wall 21 and the horizontal mounting base 22, two retaining flanges 25 bilaterally disposed between the vertical track wall 21 and the horizontal mounting base 22, two hexagonal countersunk holes 221 disposed at the horizontal mounting base 22 and spaced from the vertical track wall 21 at two opposite sides, and two internally threaded split bolts 23 respectively and downwardly raised from the bottom side of the horizontal mounting base 22 around the countersunk holes 221, each internally threaded split bolt 23 has a bottom end terminating in a plurality of equiangularly spaced hooked portions 231. The support frame 30 comprises a longitudinal sliding track 31, two pivot holes 33 bilaterally disposed near its bottom end and adapted for coupling to the stub pivots 212 of the vertical track wall 21 of the mounting frame 20, and two outward stop flanges 32 bilaterally extended from its bottom end at its rear side, each outward stop flange 32 having a retaining recess 321 for engagement with one retaining flange 25 of the mounting frame 20.

Figure 4:
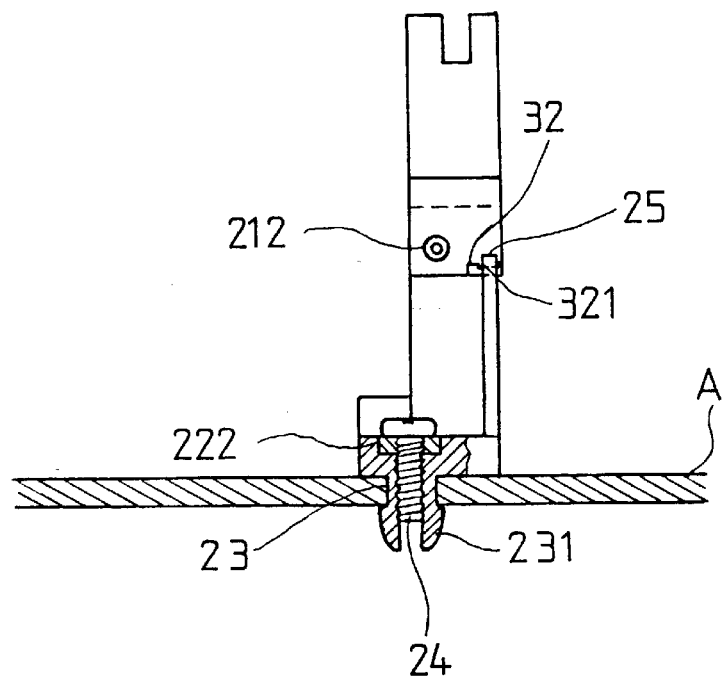
FIG. 4 is similar to FIG. 3 but showing the support frame collapsed.
Figure 3:
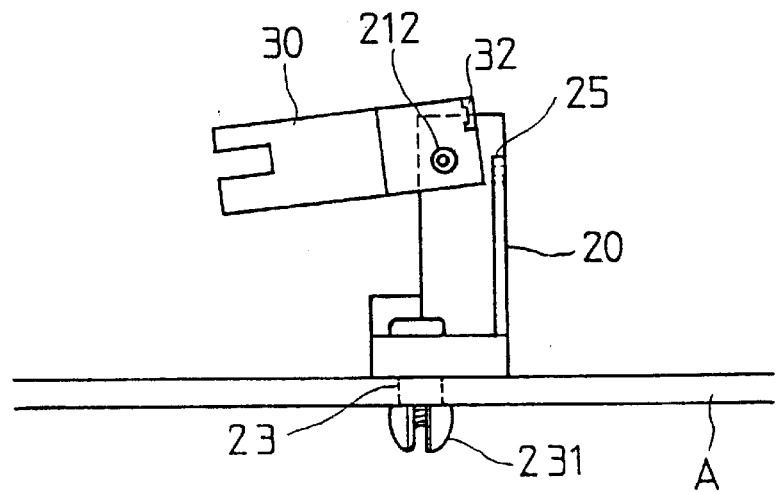
FIG. 3 is a side view in section of the present invention, showing the track device installed and set in the operative position.

The installation procedure of the present invention is simple and outlined hereinafter with reference to FIGS. 3 and 4, and FIG. 2 again, the support frame 30 and the mounting frame 20 are connected together by coupling the stub pivots 212 of the vertical track 21 of the mounting frame 2 to the pivot holes 33 of the support frame 30, then the internally threaded split bolts 23 of the mounting frame 20 are respectively inserted into respective mounting holes of the mother board, referenced by A, then two hexagon nuts 222 are respectively mounted in the hexagonal countersunk holes 221 of the mounting frame 20, and then two screws 24 are respectively threaded into the hexagon nuts 222 and the internally threaded split bolts 23 to expand the internally threaded split bolts 23, causing the hooked portions 231 to be forced into engagement with the bottom side of the mother board A. When installed, the support frame 30 can be turned about the stub pivots 212 of the mounting frame 20 between a collapsed position (see FIG. 3) and a vertical position (see FIG. 4). When the support frame 30 is turned to the vertical position, the retaining recesses 321 of the outward stop flanges 32 of the support frame 30 are respectively forced into engagement with the retaining flanges 25 of the mounting frame 20, and the longitudinal sliding track 31 of the support frame 30 is longitudinally aligned with the vertical sliding track 211 of the mounting frame 20 for guiding a CPU into the expansion slot of the mother board A. When the retaining recesses 321 of the outward stop flanges 32 of the support frame 30 are respectively forced into engagement with the retaining flanges 25 of the mounting frame 20, a click sound is produced to ensure the positioning, and the support frame 30 is firmly retained to the mounting frame 20 in the vertical position.

Figure 5:
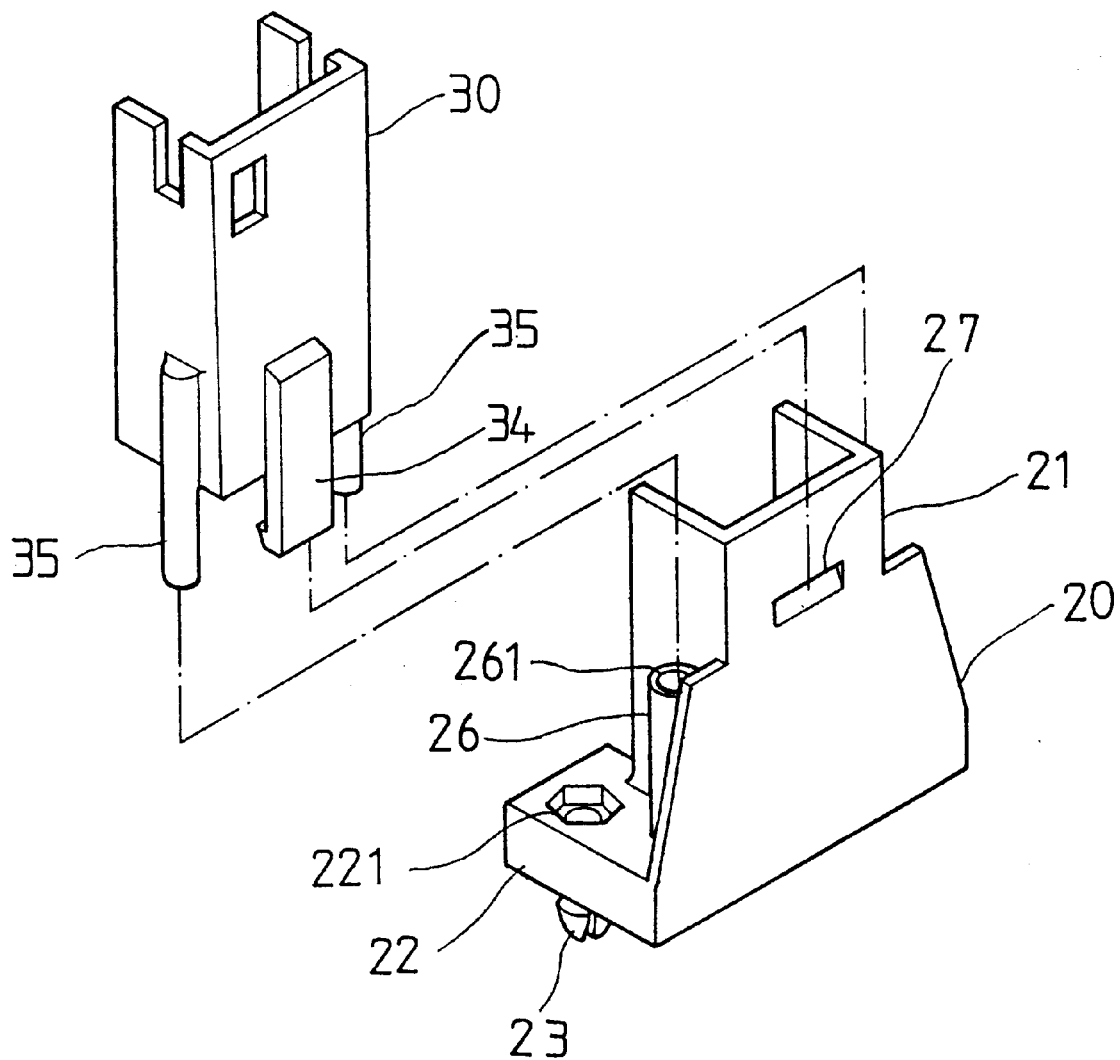
FIG. 5 is an exploded view of a track device for supporting a CPU in an extension port of a mother board according to a second embodiment of the present invention.

FIG. 5 shows a track device according to a second embodiment of the present invention. According to this embodiment, the mounting frame 20 comprises a horizontal mounting base 22, a vertical track wall 21 raised from the top side of the horizontal mounting base 22, two upright receptacles 26 raised from the top side of the mounting base 22 at two opposite sides of the vertical track wall 21, each upright receptacle 26 defining a respective plug hole 261, two hexagonal countersunk holes 221 disposed at the horizontal mounting base 22 and spaced from the vertical track wall 21 at two opposite sides, a hook hole 27 at the back side of the vertical track wall 21, and two internally threaded split bolts 23 respectively and downwardly raised from the bottom side of the horizontal mounting base 22 around the countersunk holes 221 for mounting; the support frame 30 comprises two downward plug rods 35 adapted for plugging into the plug holes 261 of the mounting frame 20, and a downwardly extended back hook 34 adapted for hooking in the hook hole 27 of the mounting frame 20. This alternate form permits the support frame 30 to be detachably connected to the mounting frame 20, however the support frame 30 cannot be turned relative to the mounting frame 20.

It is to be understood that the drawings are designed for purposes of illustration only, and are not intended as a definition of the limits and scope of the invention disclosed.

What the invention claimed is:

1. A track device for supporting a CPU in an extension port of a mother board, comprising:

a mounting frame mounted on the mother board at one side of the extension port, said mounting frame comprising a horizontal mounting base attached to a top side of the mother board, a vertical track wall raised from a top side of said horizontal mounting base, two horizontal stub pivots raised from two opposite sides of said vertical track wall, a vertical sliding track defined within said vertical track wall and said horizontal mounting base and adapted for guiding an inserted CPU into the expansion port of the mother board, two retaining flanges bilaterally disposed between said vertical track wall and said horizontal mounting base, two hexagonal countersunk holes disposed at said horizontal mounting base and spaced from said vertical track wall at two opposite sides, and two internally threaded split bolts respectively and downwardly raised from a bottom side of said horizontal mounting base around said countersunk holes and respectively plugged into respective mounting holes on the mother board, each of said internally threaded split bolts having a bottom end terminating in a plurality of equiangularly spaced hooked portions;

two hexagonal nuts respectively mounted in the hexagonal countersunk holes of said mounting frame;

two screws respectively threaded into said hexagonal nuts and said internally threaded split bolts of said mounting frame to force the hooked portions of said internally threaded split bolts into engagement with a bottom side of the mother board; and a support frame coupled to said mounting frame, said support frame comprising a longitudinal sliding track adapted for guiding an inserted CPU into the vertical sliding track of said mounting frame and the expansion port of the mother board, two pivot holes bilaterally disposed near a bottom end thereof and respectively coupled to the stub pivots of said vertical track wall of said mounting frame for permitting said support frame to be turned about the stub pivots of said vertical track wall of said mounting frame between a collapsed position and a vertical position in which the longitudinal sliding track of said support frame is longitudinally aligned with the vertical sliding track of said mounting frame, and two outward stop flanges bilaterally extended from a bottom end thereof, said outward stop flanges having a respective retaining recess for engagement with the retaining flanges of said mounting frame to hold said support frame in position when said support frame is turned to said vertical position.

2. A track device for supporting a CPU in an extension port of a mother board, comprising a mounting frame mounted on the mother board at one side of the extension port, said mounting frame comprising a horizontal mounting base attached to a top side of the mother board, and a vertical track wall raised from a top side of said horizontal mounting base and defining a vertical sliding track adapted for guiding an inserted CPU into the expansion slot of the mother board, and a support frame detachably connected to said mounting frame and defining a longitudinal sliding track adapted for guiding an inserted CPU into the vertical sliding track of said mounting frame and the expansion slot of the mother board, wherein said mounting frame comprises two upright receptacles raised from a top side of said mounting base at two opposite sides of said vertical track wall, said upright receptacles defining a respective plug hole, and a hook hole at a back side of said vertical track wall; said support frame comprises two downward plug rods adapted for plugging into the plug holes of said mounting frame, and a downwardly extended back hook adapted for hooking in the hook hole of said mounting frame.

* * * * *